United States Patent [19]
Delmee

[11] Patent Number: 6,014,928
[45] Date of Patent: Jan. 18, 2000

[54] SCREEN PRODUCT HAVING AN ENHANCED RADIATION-ABSORBING CAPACITY, IN PARTICULAR SUITABLE FOR USE IN FLAT OR ROTARY SCREEN PRINTING, AS WELL AS METHOD FOR MANUFACTURING THEREOF

[75] Inventor: Petrus H. M. Delmee, Rosmalen, Netherlands

[73] Assignee: Stork Screen B.V., Netherlands

[21] Appl. No.: 09/008,158

[22] Filed: Jan. 16, 1998

Related U.S. Application Data

[63] Continuation-in-part of application No. PCT/NL96/00288, Jul. 16, 1996.

[30] Foreign Application Priority Data

Jul. 17, 1995 [NL] Netherlands ............................ 1000825

[51] Int. Cl.[7] ................................................ B05C 17/06
[52] U.S. Cl. ..................................... 101/128.21; 101/128.4
[58] Field of Search ................................ 101/127, 128.4, 101/128.21, 129

[56] References Cited

U.S. PATENT DOCUMENTS

| | | | |
|---|---|---|---|
| 3,808,751 | 5/1974 | Usui | 51/312 |
| 3,934,504 | 1/1976 | Klemm | 101/128.3 |
| 4,004,924 | 1/1977 | Vrancken et al. | 101/470 |
| 4,033,831 | 7/1977 | Bakewell | 101/128.4 |

*Primary Examiner*—Ren Yan
*Attorney, Agent, or Firm*—Ostrolenk, Faber, Gerb & Soffen, LLP

[57] ABSTRACT

A description is given of a screen product which in particular is suitable for use in flat screen or rotary screen printing. This screen product comprises an electroformed, essentially nickel-containing metal body which determines two essentially parallel faces, and which is provided with a large number of openings, each opening extending from one of the two faces to the other, and each opening having a side wall in common with the metal. In order to prevent light scattering by the screen product, at least a part of at least one of the two faces of the screen product or the side walls of the openings is made radiation-absorbing. A method for increasing the radiation-absorbing capacity of a screen product is also described.

13 Claims, 2 Drawing Sheets

SCREEN PRODUCT HAVING AN ENHANCED RADIATION-ABSORBING CAPACITY, IN PARTICULAR SUITABLE FOR USE IN FLAT OR ROTARY SCREEN PRINTING, AS WELL AS METHOD FOR MANUFACTURING THEREOF

CROSS-REFERENCE TO RELATED APPLICATIONS

This is a continuation-in-part of International Application PCT/NL96/00288, with an International filing date of Jul. 16, 1996.

BACKGROUND OF THE INVENTION

The present invention relates to a screen product, in particular suitable for use in flat screen or rotary screen printing, comprising an electroformed, essentially nickel-containing metal body which determines two essentially parallel faces, and which is provided with a large number of openings, each opening extending from one of the two faces to the other, and each opening having a side wall in common with the metal.

Such a screen product is known and, as already mentioned, is used in particular in flat screen or rotary screen printing. Such a screen product is usually manufactured from nickel which has been formed by the electroforming process. The screen product is a flat screen or a cylindrical screen, depending on its application. In order to use the screen product in screen printing, a photosensitive lacquer composition is generally applied in a known manner to a face of the screen product and is subsequently irradiated patternwise. This patternwise irradiation can be carried out by means of a radiation source, for example a laser beam which is directed at right angles to the face with the photosensitive lacquer composition and is moved along it according to a pattern.

Another possibility is to place a mask over the coating of photosensitive lacquer, following which the photosensitive material not covered by the mask is irradiated. The irradiation is generally followed by a conventional developing operation in which, for example, the exposed parts of the photosensitive material are removed, while the unexposed parts remain behind on the material. Thus a screen product is obtained which is provided with a sealing pattern while—partially—leaving clear the openings through which in a printing operation printing paste is conveyed from one side of the screen product to the other side, in order to be deposited subsequently on a substrate material which is in contact with the screen product.

The abovementioned screen product must have such surface properties that the photosensitive materials used show excellent adhesion to the side of the screen product which during the printing process is in contact with the substrate material to be printed. In the case of the conventional screen products the adhesion with the conventional photosensitive materials is excellent.

It has been found that during—patternwise—exposure of the photosensitive lacquer material the radiation which penetrates to the surface of the screen product is largely reflected in different directions by said surface. As a result of said reflection (light scattering) of the radiation, parts of the photosensitive lacquer composition which should not have been exposed, for example because they were covered by a mask, are now in fact exposed, and consequently affect the predetermined pattern. The result of this is that the edge definition of the photosensitive material after the developing process is lower than would be the case without the occurrence of light scattering, and the consequence is that the pattern to be printed is of lower quality as regards fineness, smoothness, edge definition and edge shape than was intended.

A method is disclosed in U.S. Pat. No. 3,808,751 for making a mask or selective sand blasting of the substrate wherein a light absorbing filter layer is applied to the substrate and subsequently a photosensitive layer is formed on the filter layer. The photosensitive layer is exposed to light through a photomask and developed in the usual manner. Thereafter, the substrate is sand blasted through the sand blasted mask thus obtained in order to remove material from the substrate. The function of the light absorbing filter layer is to reduce the deterioration of the pattern formed from the photosensitive layer, which deterioration is caused by light scattering from the surface of the substrate.

SUMMARY OF THE INVENTION

The object of the present invention is to provide a solution to the abovementioned reflection problem, while still retaining the abovementioned excellent adhesion between the screen product and the photosensitive lacquer material.

To this end, the screen product according to the present invention is characterized in that at least a part of at least one of the two faces of the screen product or the side walls of the openings is made radiation-absorbing. In this case the same adhesion quality is retained.

As a result of this, the radiation penetrating through the photosensitive lacquer material and striking the treated surface of the metal screen product is absorbed by the screen product, so that scattering or reflection of the radiation is essentially avoided. It should be clear that the part of the screen product from which the scattered light can exert its influence on the photosensitive lacquer composition, such as the side walls of the openings in the screen product, is preferably made radiation-absorbing. Of course, the remainder of the face of the screen product can also be made light-absorbing.

Both faces of the screen product and also the side walls of the openings are advantageously made radiation-absorbing.

In particular, the light-absorbing part of the screen product is optically black.

Making a metal surface black effects that radiation striking this surface is absorbed to a great extent, so that little or no scattering of the radiation can occur.

In a further embodiment, the radiation-absorbing part is provided with protuberances or recesses.

Making the radiation-absorbing part in such a way produces a matting effect, with the result that scattering of light radiation is prevented.

In another expedient embodiment, the radiation-absorbing part is provided with a radiation-absorbing coating.

Such a coating is preferably specifically sensitive to certain wavelengths in the light used for the exposure step. Such a radiation-absorbing coating preferably comprises a metallic constituent which is selected from the group consisting of copper, cobalt, tin, molybdenum, chromium and phosphorus.

In a further embodiment, incident light is prevented from being scattered by the screen product, by making a part of said screen product radiation-absorbing by means of oxidation of said part.

The present invention also relates to a method for increasing the radiation-absorbing capacity of a screen product which is in particular suitable for use in flat screen or rotary screen printing, and which comprises an electroformed, essentially nickel-containing metal body which determines two essentially parallel faces and is provided with a large number of openings, each opening extending from one of the two faces to the other, and each opening having a side wall in common with the metal, wherein at least a part of at least one of the faces of the screen product or the side walls of the openings is treated in such a way that the treated part absorbs light to a greater extent than an untreated part. The side walls of the openings in particular are expediently treated in such a way that they absorb light to a greater extent than untreated parts.

The treatment expediently comprises a blacking treatment.

In a special embodiment, the treatment comprises an etching treatment or a matting treatment. Said matting treatment can comprise a chemical treatment; another possibility is for the matting to be carried out mechanically by means of, for example, sanding or sandblasting. The surface adhesion of photosensitive material to the screen product is also increased by roughening the surface of the screen product.

In a preferred embodiment, the treatment can be the application of a radiation-absorbing layer to the screen product, which layer may be comprise a metal constituent of copper, cobalt, tin, molybdenum, chromium and phosphorus. The treatment can also involve oxidation of at least a part of one face of the screen product.

BRIEF DESCRIPTION OF THE DRAWING

The present invention will be explained in greater detail below with reference to the drawing, in which.

DESCRIPTION OF PREFERRED EMBODIMENTS

Figure 1:
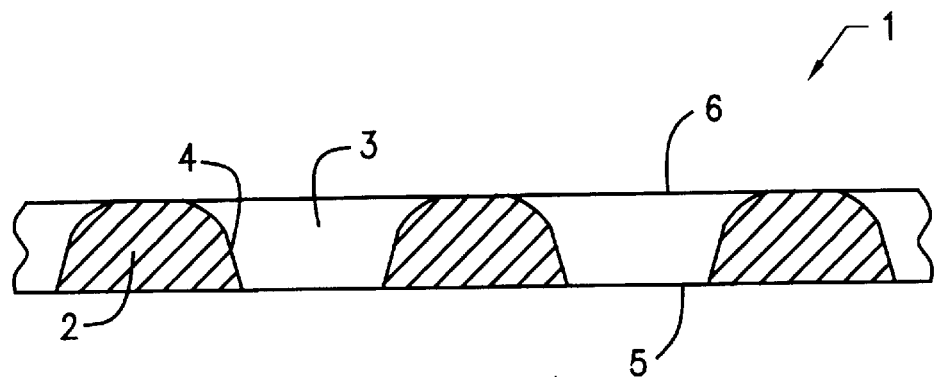
FIG. 1 shows diagrammatically in cross-section a part of a screen product.

FIG. 1 shows diagrammatically a cross-section of a screen product 1, which essentially comprises a metal body 2 provided with a large number of openings 3. The metal body 2 determines two essentially parallel faces 5 and 6. The openings 3 extend from one face to the other and have a side wall 4 in common with the metal 2.

Figure 2:
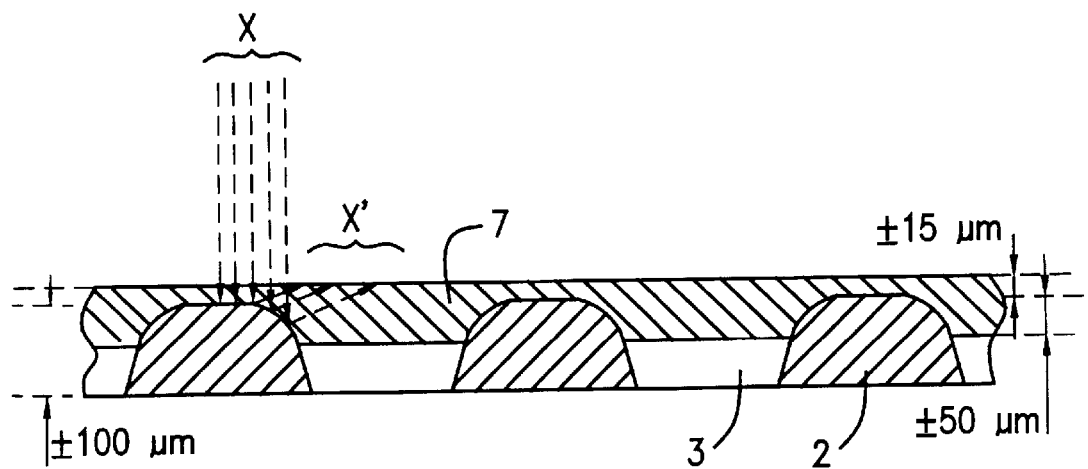
FIG. 2 shows diagrammatically a part of a screen product according to FIG. 1, in which a photosensitive lacquer composition has been applied to one side of the screen product.

FIG. 2 shows diagrammatically a similar screen product to that shown in FIG. 1, but in this case a photosensitive lacquer composition 7 has been applied to the screen product. As indicated in the figure, in the present case the thickness of the screen product without the photosensitive coating applied thereto is approximately 100 micrometres. The thickness of the photosensitive lacquer composition applied, also called the "on" thickness, is approximately 15 micrometres in this example; the "in" thickness of the photosensitive lacquer composition can be as much as 50 μm, as is the case in this example. In the case of FIG. 2, a pattern is made in the photosensitive material 7 by means of a laser beam which travels at right angles to the screen product and is moved along the screen product according to a pattern. As mentioned earlier, it is also possible to expose the photosensitive material with the interposition of a mask. The hatched lines directed at right angles to the surface indicate how a radiation beam irradiates the photosensitive lacquer composition according to a pattern, and the emergent hatched lines indicate how this radiation beam is partially reflected by the metal surface of the screen product. In general, the angle of incidence is equal to the angle of reflection in this case. Due to the fact that in the part indicated by X' the photosensitive lacquer composition is irradiated from the underside, not only the desired surface X of the photosensitive lacquer composition is irradiated, but the surface X+X' is also irradiated, which adversely affects the edge definition of the photosensitive material after development.

Figure 3:
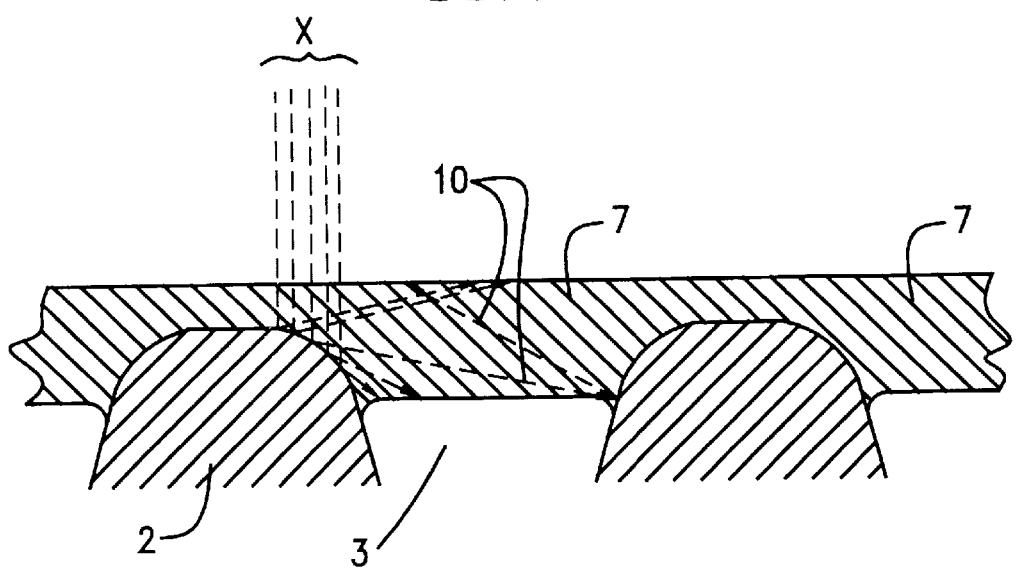
FIG. 3 shows diagrammatically a detail of a screen according to FIG. 2, in which it is illustrated in greater detail how the scattering of the light by the screen product occurs.

FIG. 3 shows in greater detail the way in which the light is scattered by the screen product. In particular, a high degree of light scattering occurs at the curvature between the side walls and the top face of the screen product. As a result of this light scattering, it is even possible for the light to strike the opposite side wall of the screen product, so that the light is reflected back again, and the effect of the light scattering is strengthened. Such a form of light scattering is indicated by reference number 10 in FIG. 3.

Figure 4:
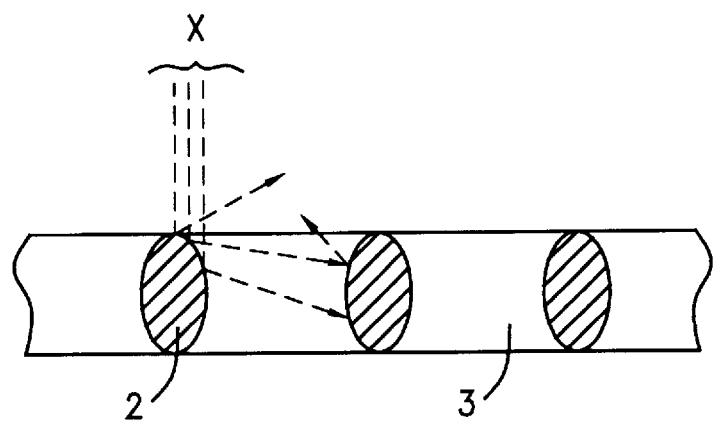
FIG. 4 shows diagrammatically a screen product of a different shape, as a result of which the light scattering is also different.

FIG. 4 shows that the shape of the side walls of the screen product has a major influence on the degree and the direction of the light scattering. Contrary to the screen products discussed and illustrated earlier, the screen product according to FIG. 4 shows a more oval shape of the metal body, with more elongated openings between the metal. Again, an incident light beam is indicated by X, and the emergent hatched lines indicate how this incident light beam is scattered.

Figure 5:
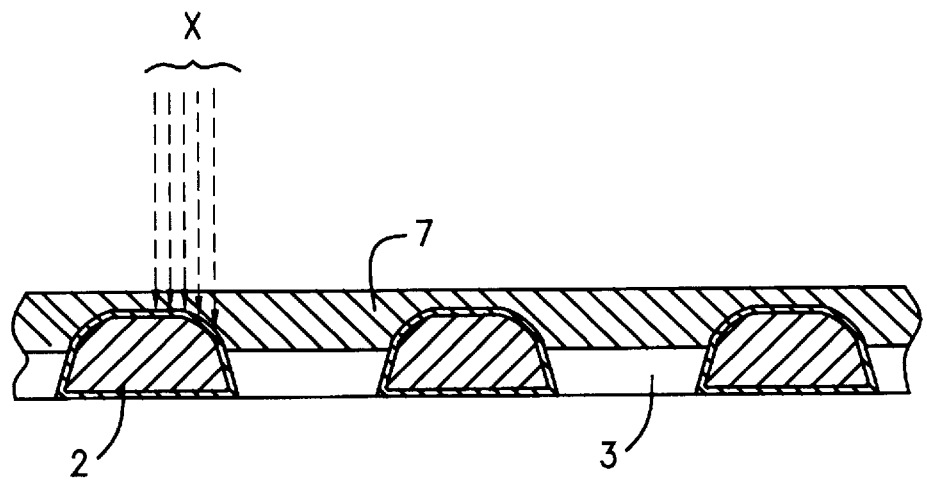
FIG. 5 shows diagrammatically a part of a screen product according to FIGS. 1–3, in which the surface of the screen product is made radiation-absorbing on all sides.

FIG. 5 shows a similar screen product to that in FIGS. 1 and 2, but in this case the entire screen product, i.e. not only the two faces of the screen product, but also its side wall, have been made radiation-absorbing, as indicated by thickened surrounding lines. Said surfaces have been made radiation-absorbing by subjecting them to blacking treatment, so that an optically black screen product is obtained. When a photosensitive lacquer composition 7 is applied to such a screen product and patternwise irradiation of the photosensitive material is carried out by means of a laser beam or otherwise, essentially no radiation reflection will occur. Therefore, only the desired surface of the photosensitive material, in this case X, will be irradiated, and the definition of the final image will be of higher quality.

Figure 6:
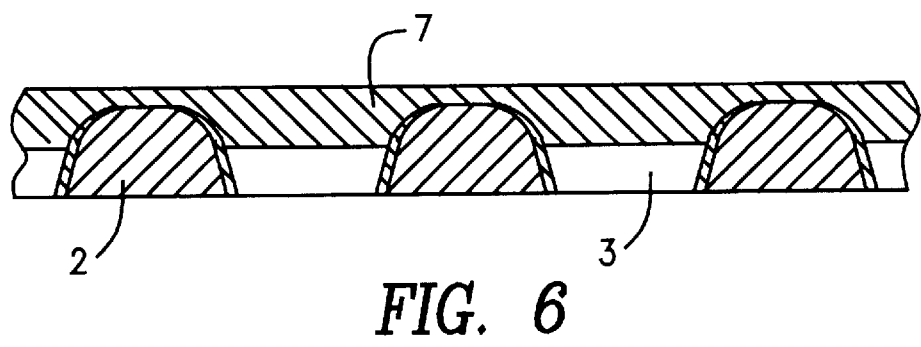
FIG. 6 shows diagrammatically a part of the screen product according to FIGS. 1–3, in which only the side walls of the openings are made radiation-absorbing.

FIG. 6 shows a part of the screen product according to FIGS. 1–3, in which only the side walls of the screen product have been made radiation-absorbing. Since the light scattering occurs essentially at the side wall and the curvature between the side wall and the face of the screen product, it is sufficient in many cases to make only this part of the screen product radiation-absorbing.

I claim:

1. Screen product for use in flat screen or rotary screen printing, comprising an electroformed, essentially nickel-containing metal body which determines two essentially parallel faces, and which is provided with a plurality of openings, each opening extending from one of the two faces to the other, and each opening having a side wall in common with the metal, wherein the screen product comprises at least a radiation-absorbing, non-photosensitive part on at least one of the two faces of the screen product or the side walls of the openings.

2. Screen product according to claim 1, wherein the radiation-absorbing part comprises both faces of the screen product and also the side walls of the openings.

3. Screen product according to claim 1, wherein the radiation-absorbing part is optically black.

4. Screen product according to claim 1, wherein the radiation-absorbing part is provided with protuberances or recesses.

5. Screen product according to claim 1, wherein the radiation-absorbing part is a radiation-absorbing layer.

6. Screen product according to claim 5, wherein the radiation-absorbing layer comprises a metallic constituent which is selected from the group consisting of copper, cobalt, tin, molybdenum, chromium and phosphorus.

7. Screen product according to claim 1, wherein the radiation-absorbing part is oxidized.

8. Method for increasing the radiation-absorbing capacity of a screen product for use in flat screen or rotary screen printing, and which product comprises an electroformed, essentially nickel-containing metal body which determines two essentially parallel faces and is provided with a plurality of openings, each opening extending from one of the two faces to the other, and each opening having a side wall in common with the metal, the method comprising the step of making at least a part of at least one of the faces of the screen product or the side walls of the openings radiation-absorbing, non-photosensitive.

9. Method according to claim 8, wherein the making comprises a blacking treatment.

10. Method according to claim 8, wherein the making comprises an etching treatment or a matting treatment.

11. Method according to claim 8, wherein the making comprises the application of a radiation-absorbing layer to the screen product.

12. Method according to claim 11, wherein the radiation-absorbing layer comprises a metallic constituent which is selected from the group consisting of copper, cobalt, tin, molybdenum, chromium and phosphorus.

13. Method according to claim 8, wherein the making comprises oxidation of at least a part of one face of the screen product.

* * * * *